United States Patent
Yu et al.

(10) Patent No.: US 7,723,226 B2
(45) Date of Patent: May 25, 2010

(54) INTERCONNECTS CONTAINING BILAYER POROUS LOW-K DIELECTRICS USING DIFFERENT POROGEN TO STRUCTURE FORMER RATIO

(75) Inventors: Chen-Hua Yu, Hsin-Chu (TW);
Yung-Cheng Lu, Taipei (TW); Pei-Ren Jeng, Hsinchu (TW); Chia-Cheng Chou, Keelung (TW); Keng-Chu Lin, Ping-Tung (TW); Chung-Chi Ko, Nauton (TW); Tien-I Bao, Hsin-Chu (TW); Shwang-Ming Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 316 days.

(21) Appl. No.: 11/654,427

(22) Filed: Jan. 17, 2007

(65) Prior Publication Data
US 2008/0171431 A1    Jul. 17, 2008

(51) Int. Cl.
*H01L 21/4763* (2006.01)

(52) U.S. Cl. ............... 438/618; 438/623; 438/637; 438/619; 438/624; 438/781; 438/725; 257/2; 257/3; 257/E47.001; 257/643; 257/758; 257/759; 427/553; 427/387

(58) Field of Classification Search ............... 438/618, 438/623, 637, 619, 624, 781, 725; 257/2, 257/3, E47.001, 643, 758, 759; 427/553, 427/387
See application file for complete search history.

(56) References Cited

U.S. PATENT DOCUMENTS

| | | | |
|---|---|---|---|
| 6,077,792 A * | 6/2000 | Farrar | 438/780 |
| 6,420,441 B1 * | 7/2002 | Allen et al. | 521/77 |
| 6,603,204 B2 | 8/2003 | Gates et al. | |
| 6,677,680 B2 | 1/2004 | Gates et al. | |
| 6,716,742 B2 | 4/2004 | Gates et al. | |
| 6,737,725 B2 * | 5/2004 | Grill et al. | 257/522 |
| 6,831,366 B2 | 12/2004 | Gates et al. | |
| 6,917,108 B2 | 7/2005 | Fitzsimmons et al. | |
| 6,930,034 B2 * | 8/2005 | Colburn et al. | 438/619 |

(Continued)

OTHER PUBLICATIONS

Chang, H. L., et al., "Robust Low-k film (k=2.1~2.5) for 90/65 nm BEOL Technology Using BiLayer Film Schemes," IEEE 2004, pp. 181-183.

*Primary Examiner*—Fernando L Toledo
*Assistant Examiner*—Ankush K Singal
(74) *Attorney, Agent, or Firm*—Slater & Matsil, L.L.P.

(57) ABSTRACT

A bilayer porous low dielectric constant (low-k) interconnect structure and methods of fabricating the same are presented. A preferred embodiment having an effective dielectric constant of about 2.2 comprises a bottom deposited dielectric layer and a top deposited dielectric layer in direct contact with the former. The bottom layer and the top layer have same atomic compositions, but a higher dielectric constant value k. The bottom dielectric layer serves as an etch stop layer for the top dielectric layer, and the top dielectric layer can act as CMP stop layer. One embodiment of making the structure includes forming a bottom dielectric layer having a first porogen content and a top dielectric layer having a higher porogen content. A curing process leaves lower pore density in the bottom dielectric layer than that left in the top dielectric layer, which leads to higher dielectric value k in the bottom dielectric layer.

19 Claims, 8 Drawing Sheets

U.S. PATENT DOCUMENTS

| | | | |
|---|---|---|---|
| 6,943,121 B2* | 9/2005 | Leu et al. | 438/725 |
| 7,208,389 B1* | 4/2007 | Tipton et al. | 438/409 |
| 7,393,776 B2* | 7/2008 | Colburn et al. | 438/619 |
| 7,611,757 B1* | 11/2009 | Bandyopadhyay et al. | 427/558 |
| 7,629,272 B2* | 12/2009 | Waldfried et al. | 438/781 |
| 2001/0014526 A1* | 8/2001 | Clevenger et al. | 438/619 |
| 2002/0127844 A1* | 9/2002 | Grill et al. | 438/622 |
| 2004/0099952 A1* | 5/2004 | Goodner et al. | 257/758 |
| 2004/0102031 A1* | 5/2004 | Kloster et al. | 438/619 |
| 2004/0102032 A1* | 5/2004 | Kloster et al. | 438/623 |
| 2004/0130032 A1* | 7/2004 | Gronbeck et al. | 257/759 |
| 2004/0137153 A1* | 7/2004 | Thomas et al. | 427/384 |
| 2005/0017363 A1* | 1/2005 | Lin et al. | 257/758 |
| 2005/0098896 A1* | 5/2005 | Huang et al. | 257/760 |
| 2005/0179140 A1* | 8/2005 | Goodner et al. | 257/773 |
| 2005/0181593 A1* | 8/2005 | Leu et al. | 438/619 |
| 2005/0191847 A1* | 9/2005 | Misawa et al. | 438/624 |
| 2006/0024976 A1* | 2/2006 | Waldfried et al. | 438/778 |
| 2006/0043591 A1* | 3/2006 | Yim et al. | 257/758 |
| 2006/0145306 A1* | 7/2006 | Lee et al. | 257/643 |
| 2007/0023870 A1* | 2/2007 | Dubois et al. | 257/642 |
| 2007/0090346 A1* | 4/2007 | Jeong et al. | 257/40 |
| 2007/0232046 A1* | 10/2007 | Miyata et al. | 438/597 |
| 2007/0281497 A1* | 12/2007 | Liu et al. | 438/781 |
| 2008/0166498 A1* | 7/2008 | Chen et al. | 427/553 |

* cited by examiner

INTERCONNECTS CONTAINING BILAYER POROUS LOW-K DIELECTRICS USING DIFFERENT POROGEN TO STRUCTURE FORMER RATIO

TECHNICAL FIELD

The present invention relates generally to interconnect structures for high speed and reliable electronic signal transmission in very large scale semiconductor integrated circuits (VLSI) and more particularly to bilayer porous low dielectric constant (low-k) interconnect structures and methods of fabricating the same.

BACKGROUND

Low-k dielectric material plus copper (Cu) dual damascene interconnect structures are well known to those skilled in the semiconductor art to be the choice for high speed and reliable signal transmission in VLSI, particularly as device feature sizes on an IC continue to scale down. While having extremely low-k value to significantly reduce inter/intra-metal layer capacitance, which in turn reduces signal RC delays and enhance signal integrity, porous low-k (PLK) dielectric materials have been facing some major technical obstacles to be fully integrated into existing IC manufacturing processes. Among those obstacles are poor control on k value and material hardness, poor control on etch rate, poor control on the etch profile in the time-controlling controlling trench etching process, poor trench/via bottom roughness, poor mechanical strength to survive chemical-mechanical polishing (CMP), and so on. These drawbacks and others in the prior art lead to poor device performance and poor device reliability, such as large variations in the metal conductor resistance due to large variations in trench depth, higher inter-metal layer capacitance due to rough trench bottoms, harmful copper diffusion due to rough via bottoms, poor device reliability due to poor interface adhesion on the rough via bottoms and/or discontinuous Cu/TaN/PLK interfaces on the rough trench bottoms, severe CMP recesses in trench dielectric due to poor material hardness and the like.

Costly extra processes have been employed to ease those problems. For instance, a separate CMP polish stop layer is deposited atop the dual damascene stack to protect the top dielectric layer from aggressive polishing and cleaning, and further acts as a CMP stop. A dedicated trench etch stop layer is fabricated between via and trench dielectrics in order to have a good control on trench etch profile. These extra processing steps, which only partially solve the above described problems, demand extra processing resources, and thus raise the overall fabricating costs.

In view of these and other problems in the prior efforts to integrate low-k dielectric into existing fabricating processes, there is a need for improved or new low-k dielectric interconnect structures and methods of fabricating the same.

SUMMARY OF THE INVENTION

In the preferred embodiments of the current invention, which comprise a bilayer low-k dielectric interconnect structure and the method of forming the same, the problems aforementioned in the prior art are generally solved or circumvented.

The first aspect of this invention provides an inventive interconnect structure aimed to solve or circumvent the problems in the prior art, which cause poor device performance and poor device reliability. The interconnect structure of this invention comprises:

a substrate having a patterned bilayer porous low-k dielectric located directly atop a surface thereof, said patterned bilayer porous low-k dielectric having an effective dielectric constant of about 2.2 or less and comprising a bottom deposited dielectric layer and a top deposited dielectric layer, which are not separated from each other by a buried layer, wherein said bottom dielectric layer and said top dielectric layer have same atomic compositions, and said bottom dielectric layer has a higher dielectric constant value k than that of the said top dielectric layer, and said bottom dielectric layer serves as an inherent etch stop layer for said top dielectric layer, and said top dielectric layer may serve as an inherent CMP polish stop layer for said top dielectric layer; and metal conductor regions formed within said patterned bilayer porous low-k dielectric.

The bilayer porous low-k dielectric interconnect structure of this invention offers better physical and chemical strength in the dielectric layer by achieving desired pore size, pore density and desired dielectric hardness via fine-tuning PECVD processing parameters and curing parameters afterwards. The improved dielectric hardness leads to more controllable etching rate and better trench/via bottom roughness, which in turn, result in better barrier layer adhesion in preventing Cu diffusion and better Cu/TaN/LK interface and reduced inter-metal layer capacitance. The improved dielectric hardness also enables the top dielectric layer to be used as a CMP polish stop layer. The avoidance of a dedicated CMP polish stop layer leads to reduction of processing costs.

The bilayer porous low-k dielectric interconnect structure of this invention offers different dielectric properties (k value and material hardness) in the bilayer dielectric, which enables the bottom dielectric layer to serve as an inherent etch stop layer for the top dielectric layer during trench etch. Comparing to the time controlling reactive ion etching (RIE) process used to etch trenches in the prior art, the existence of the inherent etch stop layer will lead to precise and uniform control over the trench depth during trench etch, which, in turn, leads to precise and uniform control over metal conductor resistance without thickness variation of metal conductors. Furthermore, the avoidance of a dedicated buried etch stop layer leads to reduction of processing costs.

The bilayer porous low-k dielectric interconnect structure of this invention offers lower intra-metal capacitance due to lower dielectric constant k value in the top dielectric layer of the bilayer structure, while maintaining the hardness of a single dielectric layer with higher k value as in prior art.

The second aspect of this invention provides a method of forming the aforementioned bilayer porous low-k dielectric, which is aimed to solve and circumvent the problems in the prior art. The method of the current invention comprises the following processing steps:

a) forming on a surface of a substrate a first dielectric layer having a first porogen content;

b) forming on the first dielectric layer a second dielectric layer having a second porogen content, the second porogen content being greater than the first porogen content;

(c) subjecting the first and second dielectric layers to a first curing process wherein substantially all porogen is removed from the first dielectric layer and wherein some, but not substantially all porogen is removed from the second dielectric layer;

(d) forming atop the second dielectric layer a third dielectric layer; and (e) subjecting the first, second, and the third dielectric layers to a second curing process, wherein substantially all porogen is removed from the second dielectric layer during the second curing process.

The third aspect of this invention provides a method of forming the aforementioned bilayer porous low-k dielectric interconnect structure, which is aimed to solve and circumvent the problems in the prior art. The method of the current invention comprises the following processing steps:

(a) forming a first dielectric layer on a surface of a substrate;

(b) forming a second dielectric layer directly atop said first dielectric layer, wherein said second dielectric layer contains more porogen;

c) subjecting the first and second dielectric layers to a first curing process wherein substantially all porogen is removed from the first dielectric layer and wherein some, but not substantially all porogen is removed from the second dielectric layer;

(d) forming via and trench openings in said first and second dielectric layers;

(e) filling said via and trench openings with at least a conductive metal;

(f) planarizing said conductive metal stopping on said second dielectric layer;

(g) forming atop the second dielectric layer a third dielectric layer; and (h) subjecting the first, second, and the third dielectric layers to a second curing process, wherein substantially all porogen is removed from the second dielectric layer during the second curing process.

The method of forming the bilayer porous low-k dielectric of this invention offers precise control on PECVD porogen-precursor to structure-former flow ratio and curing parameters afterwards to achieve the desired dielectric constant k value and hardness in the bilayer porous low-k dielectric.

The method of forming the bilayer porous low-k dielectric interconnect structure of this invention causes less increase in dielectric constant value (k damage) in the top dielectric layer during trench etching process, which leads to lower k value in top dielectric layer while maintaining the hardness of a single dielectric layer with higher k value as in prior art.

The method of forming the bilayer porous low-k dielectric interconnect structure of this invention leads to improved dielectric hardness by fine-tuning PECVD processing parameters and curing parameters afterwards. The improved dielectric hardness enables the top dielectric layer to be used as a CMP polish stop layer. The avoidance of a dedicated CMP polish stop layer leads to reduction of processing costs.

The method of forming the interconnect structure of this invention results in different dielectric properties (k value and material hardness) in the bilayer dielectrics, which enables the bottom dielectric layer to serve as an inherent etch stop layer for the top dielectric layer during trench etch, which, in turn, leads to precise and uniform control over metal conductor resistance without thickness variation of the metal conductors. Furthermore, the avoidance of a dedicated buried etch stop layer leads to reduction of processing costs.

Additional advantages of the embodiments of the current invention should be appreciated by those skilled in the art. The preferred embodiments disclosed herein may serve as a basis for carrying out modifications and improvements for the same purposes of this invention. It must be realized by those skilled in the art that such modifications and improvements on the disclose embodiments do not depart from the spirit and scope of this invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

It is believed that the embodiments of this invention are particularly advantageous in low-k dual damascene (DD) interconnect structures. Advantageous features of the embodiments may include good physical and chemical strength on inter-metal layer low-k dielectrics, lower intra-metal capacitance due to lower k of intra-metal dielectrics, improved control on inter-metal layer dielectric constant and hardness, better trench/via bottom roughness, precise and uniform control over trench depth, lower k damage during trench etching, avoidance of the need for a buried etch stop layer, avoidance of the need for CMP polish stop layers, good process integration compatibility with other damascene interconnect fabrication processes, with or without etch stop layer (ESL).

Figure 1:
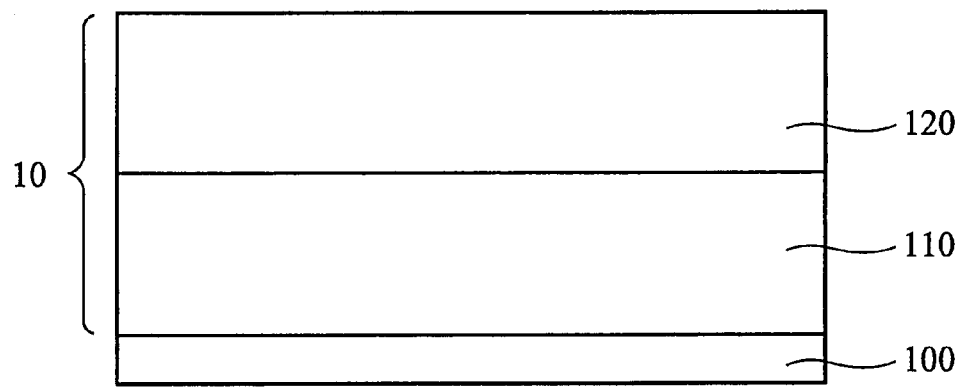
FIGS. 1-6 are cross-section views of a preferred embodiment interconnect structure through various processing steps.

Referring now to FIG. 1, there is shown a cross section of an initial device structure. The structure as illustrated in FIG. 1 includes substrate 100, which may comprise a dielectric layer, a conducting layer, a barrier layer, an adhesion promoting layer, a semiconductor wafer or any combinations thereof. When a semiconductor wafer is employed as the substrate, the wafer may include various circuits and/or devices formed thereon. For the purpose of describing preferred embodiments of this invention, the substrate 100 comprises a barrier metal layer (TaN) over a prior metallized Cu layer (not shown), as in a typical copper damascene process. While the layer is shown as continuous, those skilled in the art will recognize the underlining layers may be patterned regions such as metallic structures, as are well known in the art. Further illustrated in FIG. 1 are a first low-k dielectric layer 110 formed directly atop the substrate 100 and a second low-k dielectric layer 120 formed directly atop the first low-k dielectric layer 110. The first low-k dielectric layer 110 and the second low-k dielectric layer 120 employed in preferred embodiments of the current invention have the same atomic composition and preferably are both porous. It is noted that the term "low-k" denotes dielectric materials having a dielectric constant k less than that of the traditional dielectric material $SiO_2$ (3.9-4.2). More preferably, the term "low-k" as used herein denotes dielectric materials having a dielectric constant k from about 2.1 to about 2.9, although materials having other dielectric constants are not excluded. The exact dielectric constant k of each of the layers that make up the bilayer dielectrics will be described herein below.

The first and second low-k dielectrics are porous materials formed by an in-situ two-step step deposition process (bilayer). The material of the first low-k dielectric layer 110 and the second low-k dielectric layer 120 could be inorganic or organic low-k dielectric materials of various kinds formed by various film depositions techniques, such as chemical vapor deposition (CVD), plasma-enhanced chemical vapor deposition (PECVD), spin-on coating, and the like. In preferred embodiments of the present invention, the low-k dielectric material of the first and second dielectric layer is porous organic dielectric material of the same atomic composition selected from a group consisting of organic silicate glass (OSG), porous methylsilsesquioxane (p-MSQ), and hydrogen silsesquioxane (HSQ), although other organic dielectric materials comprising C, O and H are not excluded. The first dielectric layer 110 (sometimes referred to herein as a via dielectric) is formed by a PECVD process followed by a subsequent pore formation treatment (PECVD porogen approach). In a preferred embodiment, A PECVD porogen approach is conducted by introducing a pore forming precursor (porogen-precursor) and an OSG structure forming precursor (structure-former) in gaseous form into a PECVD chamber during deposition. The flow ratio of the porogen-precursor to the OSG structure-former is controlled by the deposition apparatus during deposition. The deposited dielectric material thus contains the porogen. In a subsequent step, the porogen is removed by a thermal curing process to create pores in the deposited material, as will be described below. In preferred embodiments of the current invention, the porogen-precursor is selected from a group consisting of ATRP (alpha-Terpinene), beta-Terpinene, gamma-Terpinene, and the like. The porogen-precursor to the structure-former flow ratio and curing parameters determine the dielectric constant k value and the hardness of the dielectric layer.

After the formation of the first dielectric layer, the second dielectric layer 120 (sometimes referred to herein as a trench dielectric) is formed directly atop the first dielectric layer 110 preferably by a similar plasma-enhanced chemical vapor deposition (PECVD) process with a higher porogen-precursor to structure-former flow ratio. In preferred embodiments of this invention, the structure-former in forming the second dielectric layer is the same porous organic dielectric material as used in forming the first dielectric layer. After deposition of the second dielectric layer, a bilayer low-k dielectrics structure 10 is formed by the in-situ two-step deposition process as illustrated in FIG. 1.

Following the formation of the bilayer low-k dielectrics 10, the bilayer dielectrics are subjected to a first thermal curing process. This step heats the porogen embedded in the bilayer dielectrics above its decomposition temperature and generates pores in the bilayer dielectrics. In a preferred embodiment, the thermal curing is conducted by an ultraviolet (UV) thermal process. The pore size and volume percentage porosity in a post-cured dielectric determine its dielectric constant k value. The curing parameters determine the hardness of the cured material. In preferred embodiments, the curing parameters are chosen such that the first dielectric layer (via dielectric) 110 is fully cured and fully crosslinked to achieve a desired higher dielectric constant relative to second dielectric layer 120 and desired hardness, but the second dielectric layer (trench dielectric) 120 is only partially cured and partially crosslinked, due to it higher porogen content. The cured layers are shown in FIG. 2 and are labeled as cured bilayer low-k dielectrics 10' including fully cured bottom dielectric layer 110' and partially cured top dielectric layer 120'.

In a preferred embodiment, the PECVD process used to form the bottom dielectric layer 110 is conducted at a temperature of from about 220° C. to about 270° C., more preferably about 250° C., for a time period of from about 10 seconds to 3 minutes with dilute gas flow rate of about 1000 SCCM to 5000 SCCM and plasma RF power of about 400 W to 1000 W. The porogen-precursor to total gas flow ratio is from about 50% to about 60% with porogen-precursor flow rate of about 2000 SCCM out of total gas flow rate of 4000 SCCM. In forming the top dielectric layer 120, the PECVD process is conducted at a temperature of from about 220° C. to about 270° C., more preferably about 250° C., for a time period of from about 10 seconds to 3 minutes with dilute gas flow rate of 1000 SCCM to 5000 SCCM and plasma RF power of 400 W to 1000 W. The porogen-precursor to total gas flow ratio is from about 70% to about 80% with porogen-precursor flow rate of about 3000 SCCM out of total gas flow rate of 4000 SCCM.

As discussed above, and for reasons that will become apparent below, it is preferred that the first curing process is conducted under parameters that are sufficient to fully cure and fully cross-link bottom dielectric layer 110, while only partially curing top dielectric layer 120. While ideally "fully cured" implies 100% of the porogen is removed, as a practical matter, a layer is considered fully cured if less than about 10% porogen remains after curing. In preferred embodiments, the UV curing of the first curing process is conducted with a UV power density of 1500 W/cm$^2$ at a temperature of from about 370° C. to about 430° C. for about 5 to 15 minutes, more preferably from about 390° C. to about 400° C. for about 5 to 15 minutes. The hardness reached after the curing will allow the top dielectric layer 120' to act as CMP polish stop layer.

Figure 2:
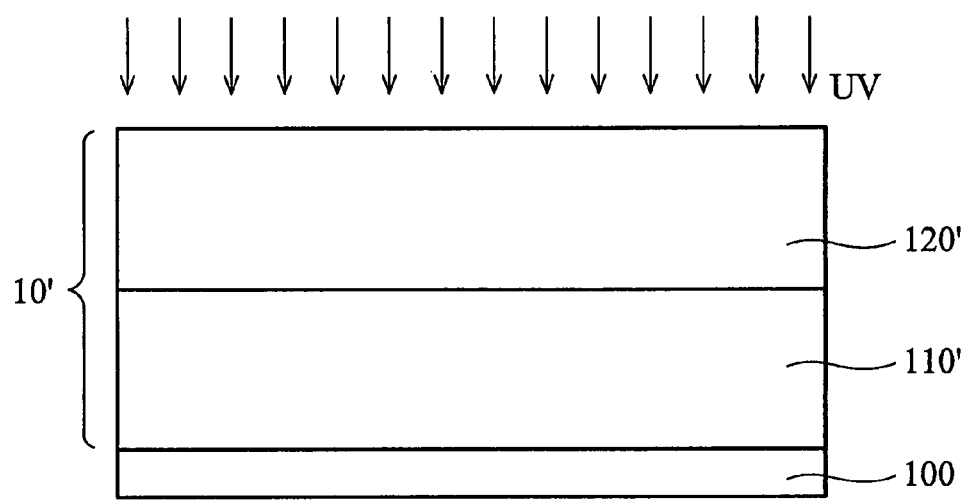
Figure 3:
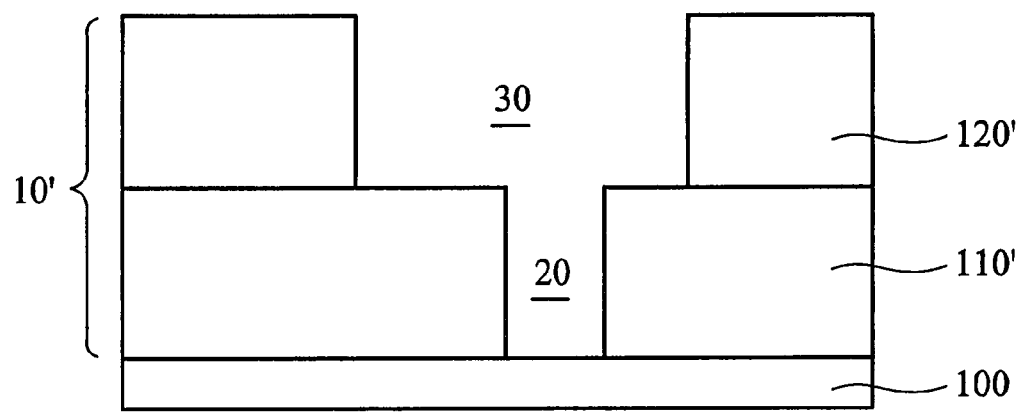

Following the first curing process, the structure shown in FIG. 2 is then subjected to a photolithography and etching process to form openings for metal conductors as shown in FIG. 3. In a preferred embodiment, a "Via-First" photolithography and etching process is employed. First, a photoresist (not shown) is applied on the cured bilayer material 10' and lithographically exposed to form a pattern of vias. The pattern of vias is then developed in the photoresist, a process well known to those skilled in the art. Next, an anisotropic etching process is applied to cut via openings 20 in the bilayer dielectrics. The etching cuts through the top partially cured dielectric and the bottom fully cured dielectric and stops on the substrate 100. In a preferred embodiment, the anisotropic plasma etching used to cut via openings 20 is conducted in a RIE reactor. The etchant gas is a mixture containing $CF_4$ at a flow rate of between about 10 SCCM and 50 SCCM, $C_4F_8$ at a flow rate of between about 5 SCCM and 30 SCCM, and a carrier gas of Ar and $N_2$ at a flow rate of between about 300 SCCM and 1000 SCCM. The flow rate of the carrier gas is adjusted to maintain a pressure of between about 20 mTorr and 60 mTorr in the etching chamber. An RF discharge having a power of between 1000 Watts and 2000 Watts is struck in the etch chamber and the bottom organic dielectric layer 110' is etched until the etch endpoint is reached. The etch selectivity over the substrate layer is between about 1:20 and 1:100. An over etch period of about 20% is allowed to assure complete removal of the bottom dielectric layer at the base of via openings 20 and exposing the substrate layer 100 for forming via contacts.

The photoresist is then stripped, and a new photoresist (not shown) is applied to the structure. The new photoresist is lithographically exposed to form a pattern of trenches and the trench pattern is developed in the photoresist. An anisotropic etching process is applied to cut through the partially cured top dielectric layer and stops at the fully cured bottom dielectric layer. This etching process forms trench openings 30. In some preferred embodiments, the bottom dielectric layer 110' acts as an inherent etch stop layer for trench etch in top dielectric layer 120' and a buried etch stop layer is not required. This is achieved by the unique dielectric properties of higher k value and higher material hardness in the fully cured bottom dielectric layer formed by this inventive process. In a preferred embodiment, the anisotropic plasma etching used to cut the trench openings 30 is conducted in the same RIE reactor. The etchant gas is a mixture containing $CF_4$ at a flow rate of between about 100 SCCM and 600 SCCM, and a carrier gas of Ar at a flow rate of between about 150 SCCM and 650 SCCM. The flow rate of the carrier gas is adjusted to maintain a pressure of between about 100 mTorr and 200 mTorr in the etching chamber. An RF discharge having a power of between 200 Watts and 750 Watts is struck in the etch chamber and the top organic dielectric layer 120' is etched until the etch endpoint is reached. The etch selectivity over the bottom dielectric layer 110' is between about 1:1.05 to 1:1.2. A time-mode controlling with about 10% over-etch is allowed to assure complete removal of the top dielectric layer 120' at the base of trench openings 30 and exposing the bottom dielectric layer 110' for metal filling.

In other embodiments, a "Trench First" photolithography and etching process could be employed to form openings for metal conductors. The bottom dielectric layer 110' can also be employed as an etch stop layer for trench etch in top dielectric layer 120', as will be recognized by those skilled in the art.

Figure 4:
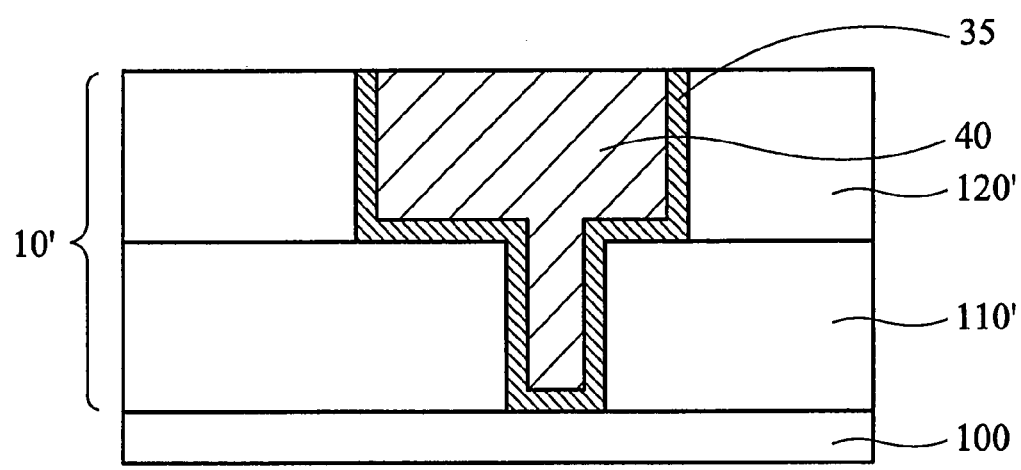

The via and trench openings 20, 30 are then filled with a conductive metal 40 and planarized so as to provide the structure shown in FIG. 4. In preferred embodiments, a barrier layer 35 is formed in the metal openings prior to filling with the conductive metal. The barrier layer 35 preferably prevents the diffusion of the conductive metal into the dielectric layers. The material of such barrier layer is preferably selected from the group consisting of titanium nitride (TiN), tantalum nitride (TaN), tantalum (Ta), titanium (Ti), tungsten (W), tungsten nitride (WN), chromium (Cr), niobium (Nb), molybdenum (Mo) and mixtures thereof, although other materials may be employed. The barrier layer 35 is preferably formed by conventional deposition processes known to those skilled in the art, including CVD, plasma-assisted CVD, sputtering, electroplating, and the like. In a preferred embodiment, the barrier metal is TaN and the barrier layer is formed by reactive sputtering. The term "conductive metal" is preferably a metal selected from the group consisting of aluminum (Al), copper (Cu), silver (Ag), tungsten (W), and alloys thereof, although other metals are within the contemplated scope of the invention. One skilled in the art will recognize that other conductors could also be employed, including, e.g., conductive ceramics. The conductor is filled in the openings utilizing conventional deposition processes known to those skilled in the art, including CVD, plasma-assisted CVD, sputtering, electroplating, etc. In a preferred embodiment, Cu is the conductive metal and is filled in the openings by electroplating.

After filling the trench and via openings with a conductor, the structure is subjected to a conventional planarization process such as chemical mechanical polishing (CMP), which removes any conductor above the top dielectric layer 120'. As discussed above, in preferred embodiments, the curing parameters of the first curing process may be chosen such that the top dielectric layer (trench dielectric) 120' can reach a desired film hardness after curing, which enables the top dielectric layer to act as CMP polish stop layer. In other embodiments, a separate CMP stop layer (not shown) can be deposited atop the top dielectric layer, with materials and deposition techniques familiar to those skilled in the art.

Figure 5:
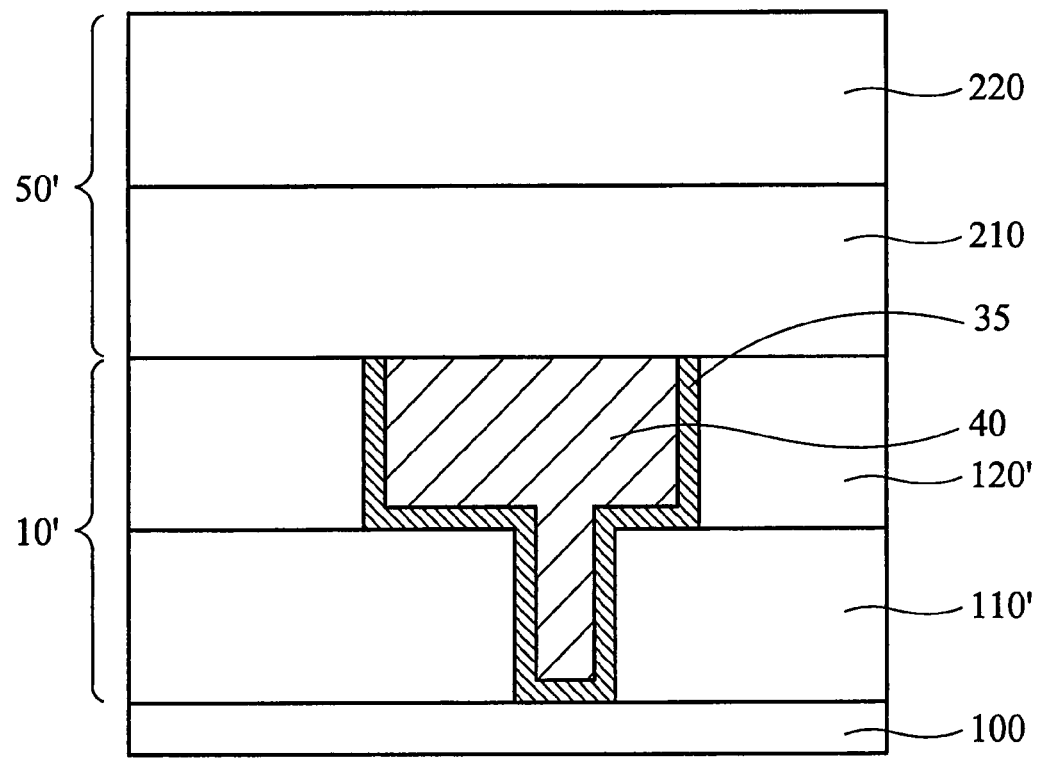

Following the proceeding step, an additional level of dielectric layer 210 is formed directly atop the planarized conducting feature 40, as shown in FIG. 5. Dielectric layer 210 constitutes the first dielectric layer of the bilayer low-k dielectric interconnect structure of the next (higher) conducting level and is preferably formed by a similar plasma-enhanced chemical vapor deposition (PECVD) process as used in the formation of the first dielectric layer 110 of the previous (lower) conducting level, although other low-k dielectric materials and deposition conditions are not excluded.

After the formation of dielectric layer 210, another dielectric layer 220 is formed directly atop dielectric layer 210. Dielectric layer 220 constitutes the second dielectric layer of the bilayer low-k dielectric interconnect structure of the next (higher) conducting level and is preferably formed by a similar plasma-enhanced chemical vapor deposition (PECVD) process as used in forming dielectric layer 210, but with a higher porogen-precursor to structure-former flow ratio. In preferred embodiments, same dielectric material, PECVD porogen-precursor to structure-former flow ratio, and other PECVD processing parameters are used to form layer 220 as those used in the formation of the second dielectric layer 120 of the lower conducting level, although other low-k dielectric materials and deposition conditions are not excluded. After deposition of the second dielectric layer 220, a bilayer low-k dielectrics structure 50 of the higher conducting level is formed as illustrated in FIG. 5.

Figure 6A:
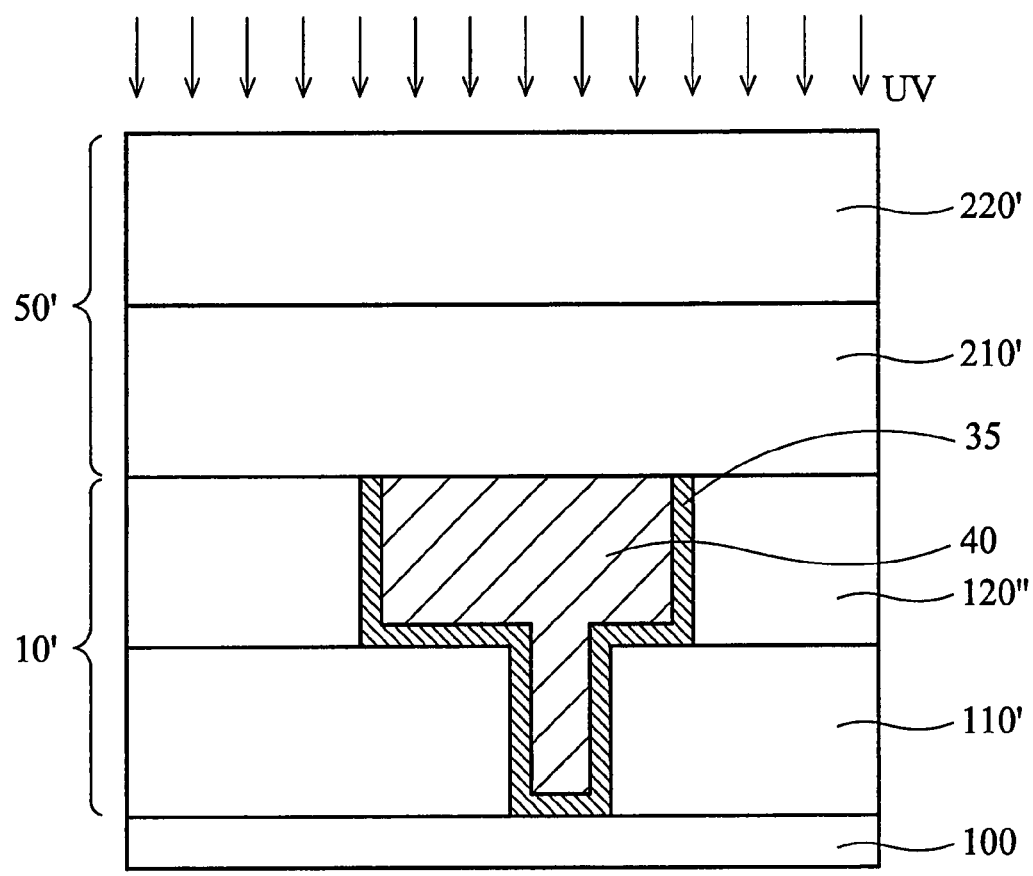

Following the formation of bilayer low-k dielectrics 50, the whole dielectric interconnect structure is subjected to a second thermal curing process, which is preferably conducted by an ultraviolet (UV) thermal process such as used in the first thermal curing process. In preferred embodiments, the curing parameters are chosen such that dielectric layer 210 is fully cured and fully crosslinked to achieve a desired higher dielectric constant relative to dielectric layer 220 and desired hardness, but the dielectric layer 220 is only partially cured and partially crosslinked, due to its higher porogen content. After the second thermal curing, the cured bilayer low-k dielectrics of the second conducting level is denoted as 50' as shown in FIG. 6a, which includes fully cured dielectric layer 210' and partially cured dielectric 220'. In preferred embodiments, this second curing process will fully cure and cross-link dielectric layer 120', recalling from the previous discussion that layer 120' was only partially cured in the first curing step. The fully cured top dielectric layer of the previous bilayer dielectric interconnect structure 10' in the lower conducting level is denoted as 120" as shown in FIG. 6a.

Figure 6B:
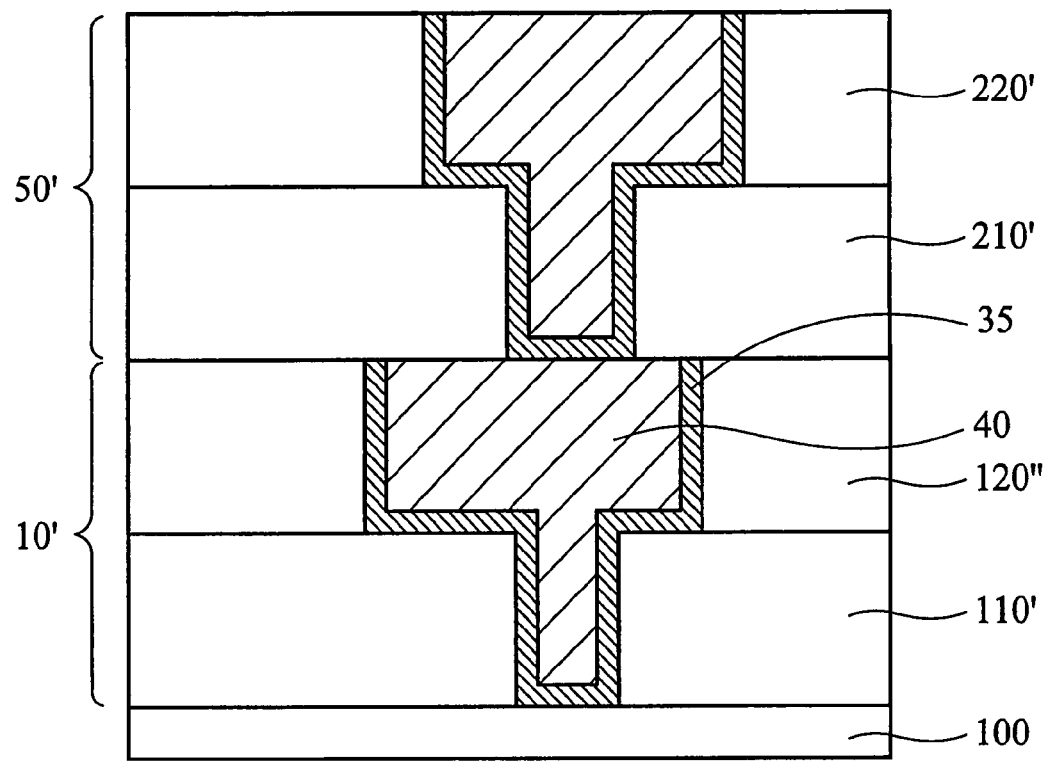

The necessary photolithography, via/trench etch and conductor filling processes to complete the formation of the bilayer low-k dielectric interconnect structure in the second (higher) conducting level can now follow by repeating the respective steps described earlier in forming the previous bilayer low-k dielectric interconnect structure in the lower conducting level. The resulting structure is illustrated in FIG. 6b.

Figure 7:
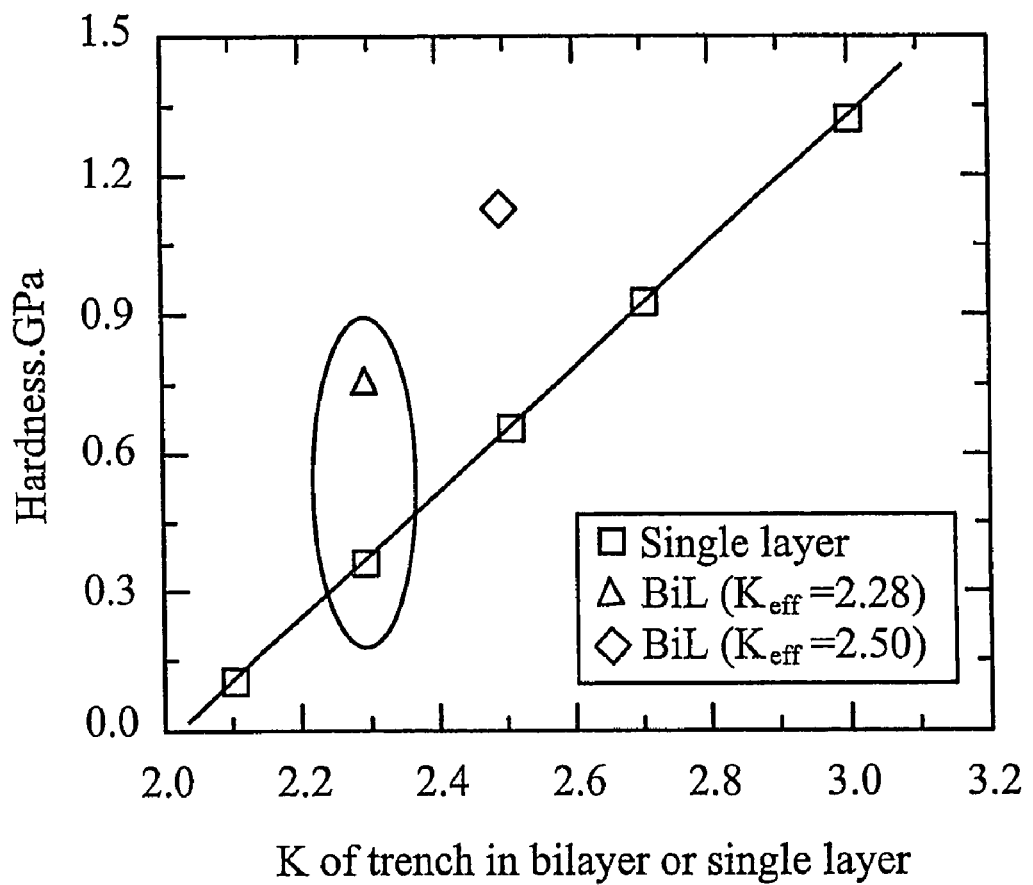
FIG. 7 shows the hardness of various bilayer dielectrics relative to a single layer dielectric.
Figure 8:
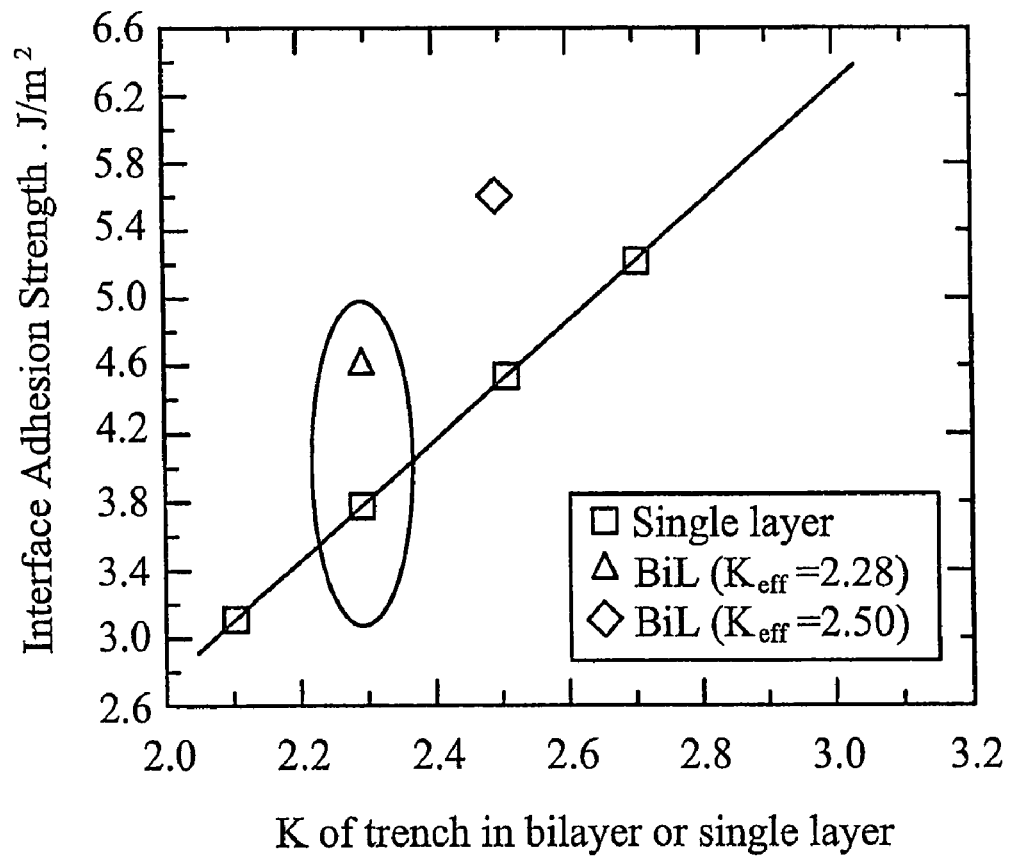
FIG. 8 shows the interface adhesion of various bilayer dielectrics relative to a single layer dielectric.

In one preferred embodiment, a bilayer porous low-k dielectric structure is formed by porous low-k dielectric material OSG using a 60% porogen-precursor to total gas flow ratio in forming bottom dielectric layer 110 and a 80% porogen-precursor to total gas flow ratio in forming top dielectric layer 120. The first UV thermal curing process is conducted with UV power density of about 1500 $W/cm^2$ at a temperature of from about 390° C. to about 400° C. for about 5 to 15 minutes. The second UV thermal curing process is conducted with UV power density of about 1500 W/cm² at a temperature of from about 390° C. to about 400° C. for about 5 to 15 minutes. After the two curing processes, the bottom dielectric layer 110' has a pore size of from about 10 Å to about 20 Å at a volume percentage porosity of from about 20% to 25%. The top dielectric layer 120" has a pore size of from about 10 Å to about 20 Å at a volume percentage porosity of from about 25% to about 35%. The formed bilayer trench/via dielectrics are (more porous)/(less porous) with k=2.2/2.3 having an effective dielectric constant of around 2.24. The bottom dielectric layer is from about 600 Å to 1000 Å in thickness and the top dielectric layer is from about 900 Å to 2000 Å in thickness. FIG. 7 shows the hardness of various bilayer dielectrics relative to a single layer dielectric. Comparing with a k=2.2 single layer, 0.2 GPa to 0.3 GPa hardness improvement is achieved by the 2.2/2.3 bilayer without raising the k value and sacrificing the interline capacitance. FIG. 8 shows the interface adhesion strength of various bilayer relative to a single layer dielectric. Comparing with a k=2.2 single layer, 0.3 J/m² to 0.5 J/m² interface adhesion improvement is accomplished by the 2.2/2.3 bilayer.

In another preferred embodiment, bilayer porous low-k dielectric structure is formed by porous low-k dielectric material OSG using a 50% porogen-precursor to total gas flow ratio in forming bottom dielectric layer 110 and a 80% porogen-precursor to total gas flow ratio in forming top dielectric layer 120. The first UV thermal curing process is conducted at a temperature of from about 390° C. to about 400° C. for about 5 to 15 minutes. The second UV thermal curing process is conducted at a temperature of from about 390° C. to about 400° C. for about 5 to 15 minutes. After the two curing processes, the bottom dielectric layer 110' has a pore size of from about 10 A to 20 A at a volume percentage porosity of from about 10% to 25%. The top dielectric layer 120" has a pore size of from about 10 A to 20 A at a volume percentage porosity of from about 15% to 30%. The formed bilayer trench/via dielectrics are (more porous)/(less porous) with k=2.2/2.4 having an effective dielectric constant of 2.28. FIG. 7 shows the hardness of various bilayer relative to a single layer dielectric. Comparing with a k=2.2 single layer, 0.3 GPa to 0.5 GPa hardness improvement is achieved by the 2.2/2.4 bilayer without raising the k value and sacrificing the interline capacitance. FIG. 8 shows the interface adhesion strength of various bilayer relative to a single layer dielectric. Comparing with a k=2.2 single layer, 0.5 J/m² to 0.8 J/m² interface adhesion improvement is accomplished by the 2.2/2.4 bilayer.

The improvement of hardness by the bilayer structure, as illustrated in the preferred embodiments, is due to the enhanced material density in the bottom dielectric layer, which increases the total effective hardness of the bilayer dielectrics, compared to single dielectric layer of prior art. The improvement in interface adhesion is also appreciable to those skilled in the art. Good interface adhesion is achieved when two materials have the same or similar hardness. By creating a bottom dielectric layer 110' of intermediate hardness between a more porous, less hard top dielectric layer 120" and very hard substrate layer 100 (in preferred embodiments, the substrate is a diffusion barrier layer of high hardness), improvement of adhesion on both interfaces should be expected. The improvement of film hardness and interface adhesion of the bilayer dielectrics lead to better interface peeling and CMP recess resistance.

Figure 9:
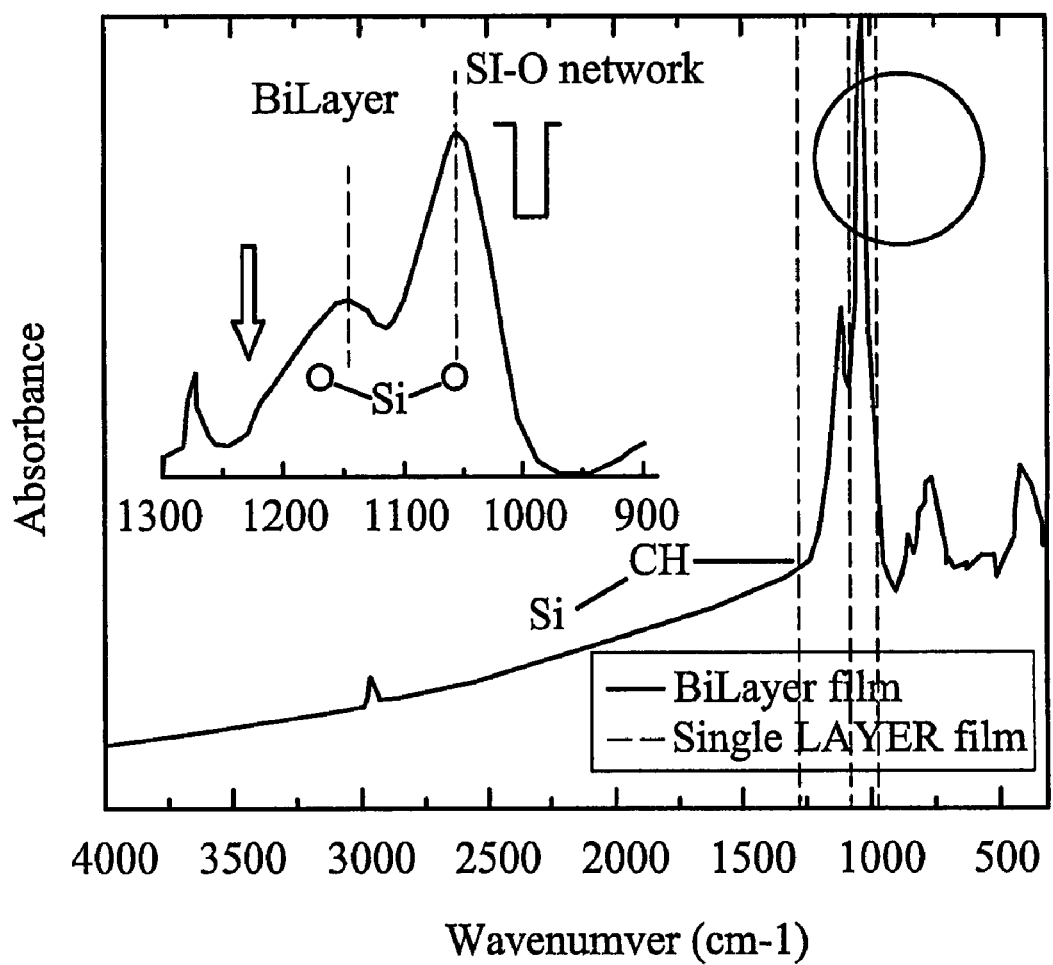
FIG. 9 shows the cross-link of bilayer dielectrics relative to a single layer dielectric.

Also as shown in FIG. 9, the 2.2/2.3 bilayer of one preferred embodiment contains more Si-O bonding networks in the dielectric. Those skilled in the art should recognize that the Chlorine (Cl) containing plasma etchant used for etching organic low-k materials exhibits strong etching selectivity over $SiO_2$. The existence of more Si—O bonding networks in the dielectrics of preferred embodiments slows down the etching on organic low-k materials, which in turn, leads to more controllable etching rate and better trench bottom and via bottom roughness, as recognized by those skilled in the art.

The method of forming the bilayer porous low-k dielectric interconnect structure of embodiments of this invention offers improved control on achieving the desired dielectric constant k value and hardness in the bilayer dielectrics by adjusting the PECVD porogen-precursor to structure-former flow ratio and curing parameters afterwards.

The above described bilayer porous low-k dielectric interconnect structure offers better physical strength (improved dielectric hardness) and chemical strength (stronger chemical resistance to etching/ashing due to more Si—O bonding networks in the dielectric). These improvements in the bilayer dielectric layer lead to more controllable etching rate and better trench/via bottom roughness, which in turn, result in better barrier layer adhesion in preventing Cu diffusion and better reliability performance on the interface at the via bottom.

The process of trench etching in preferred embodiments causes less increase in dielectric constant value (k damage) in the top dielectric layer. As recognized by those skilled in the art, carbon (C) content in a low-k dielectric is consumed during plasma etching to form volatile by-products and the loss of C content causes increase in dielectric constant value k. Also familiar to those skilled in the art is that porogen residue in a dielectric material adds to the carbon content. In preferred embodiments, the partially cured top layer contains more carbon in the dielectric, due to porogen residue. After trench etching, there is more carbon (C) left in the dielectric, compared to a fully cured dielectric layer having no porogen residue, and the higher carbon content causes less increase in dielectric constant value. The lower k damaging after trench etching in the top dielectric layer of the bilayer structure leads to lower intra-metal capacitance.

The method of forming the interconnect structure of preferred embodiments of this invention results in different dielectric properties (k value and material hardness) in the bilayer dielectrics, which enables the bottom dielectric layer to serve as an inherent etch stop layer for the top dielectric layer during trench etch. Comparing to the time controlling reactive ion etching (RIE) process used to etch trenches in the prior art, the existence of the inherent etch stop layer will lead to precise and uniform control over the trench depth during trench etch, which, in turn, leads to precise and uniform control over metal conductor resistance without thickness variation of the metal conductors. Furthermore, the avoidance of a dedicated buried etch stop layer leads to reduction of processing costs.

What is claimed is:

1. A method for fabricating a bilayer porous low-k dielectric, the method comprising:
   forming on a surface of a substrate a first dielectric layer having a first porogen content;
   forming on the first dielectric layer a second dielectric layer having a second porogen content, the second porogen content being greater than the first porogen content;
   subjecting the first and the second dielectric layers to a first curing process wherein substantially all porogen is removed from the first dielectric layer thereby forming a first porous matrix within the first dielectric layer, and wherein some, but not substantially all porogen is removed from the second dielectric layer;

forming atop the second dielectric layer a third dielectric layer; and subjecting the first, the second, and the third dielectric layers to a second curing process, wherein substantially all porogen is removed from the second dielectric layer during the second curing process thereby forming a second porous matrix within the second dielectric layer.

2. The method of claim 1, wherein the first, the second and third dielectric layer comprise a low-k dielectric.

3. The method of claim 1, wherein the forming a first, second and third dielectric layer comprises using a chemical vapor deposition (CVD) process.

4. The method of claim 1, wherein the first and the second curing processes are UV thermal curing process.

5. The method of claim 1, wherein said porogen comprises a material selected from the group consisting essentially of ATRP (alpha-Terpinene), beta-Terpinene, gamma-Terpinene, and the like.

6. The method of claim 2, wherein said low-k dielectric is an organic dielectric material, comprising C, O and H.

7. The method of claim 6, wherein said organic dielectric material comprises a material selected from the group consisting essentially of organic silicate glass (OSG), porous methylsilsesquioxane (p-MSQ), and hydrogen silsesquioxane (HSQ), and the like.

8. A method for fabricating a dielectric semiconductor interconnect structure, the method comprising:

forming a first dielectric layer on a surface of a substrate, wherein said first dielectric layer contains a first porogen content;

forming a second dielectric layer directly atop said first dielectric layer, wherein said second dielectric layer contains a second porogen content, the second porogen content being greater than the first porogen content;

subjecting the first and the second dielectric layers to a first curing process wherein substantially all the first porogen content is removed from the first dielectric layer thereby forming a first porous matrix within the first dielectric layer, and wherein some, but not substantially all the second porogen content is removed from the second dielectric layer;

forming via and trench openings in said first and second dielectric layers;

filling said via and trench openings with at least a conductive metal;

planarizing said conductive metal stopping on said second dielectric layer;

forming atop the second dielectric layer a third dielectric layer; and subjecting the first, the second, and the third dielectric layers to a second curing process, wherein substantially all the second porogen content is removed from the second dielectric layer during the second curing process thereby forming a second porous matrix within the second dielectric layer.

9. The method of claim 8 wherein said substrate comprising a dielectric layer, a conducting layer, a baffler layer, an adhesion promoting layer, a semiconductor wafer or any combinations thereof.

10. The method of claim 8 wherein first, second and third dielectric layers are low-k dielectric materials, comprising C, O and H.

11. The method of claim 8 wherein the said first, second and third dielectric layers are formed by chemical vapor deposition (CVD).

12. The method of claim 8 wherein the said first and second curing processes are ultraviolet (UV) thermal curing processes.

13. The method of claim 8 wherein forming via and trench openings includes two lithographic and etching steps.

14. The method of claim 10 wherein said first, second and third low-k dielectric materials are organic dielectric materials selected from the group consisting essentially of organic silicate glass (OSG), porous methylsilsesquioxane (p-MSQ), and hydrogen silsesquioxane (HSQ), and the like.

15. A method for fabricating a low-k dielectric, the method comprising:

forming a first dielectric layer on a substrate, the first dielectric layer comprising a first concentration of a porogen;

forming a second dielectric layer on the first dielectric layer, the second dielectric layer comprising a second concentration of the porogen, the second concentration being greater than the first concentration, wherein the second dielectric layer is physically contacting the first dielectric layer;

after forming the second dielectric layer, removing substantially all the porogen from the first dielectric layer but not the second dielectric layer using a first curing process;

forming a third dielectric layer on the second dielectric layer, wherein the third dielectric layer is physically contacting the second dielectric layer; and using a second curing process to remove substantially all remaining porogen from the second dielectric layer.

16. The method of claim 15, wherein forming a first dielectric layer comprises using a first flow ratio of a porogen precursor and a structure former, wherein forming a second dielectric layer comprises using a second flow ratio of the porogen precursor and the structure former, and wherein the second flow ratio is larger than the first flow ratio.

17. The method of claim 15, wherein the porogen comprises a material selected from the group consisting of ATRP (alpha-Terpinene), beta-Terpinene, and gamma-Terpinene.

18. The method of claim 15, wherein the first and the second curing processes are ultraviolet (UV) thermal curing processes.

19. A method for fabricating a low-k dielectric, the method comprising:

forming a first dielectric layer on a top surface of a substrate, the first dielectric layer comprising porogen;

forming a second dielectric layer having the porogen, wherein the second dielectric layer is disposed on a top surface of the first dielectric layer;

transforming the first dielectric layer to a first low-k dielectric layer having a first porous matrix by subjecting the first and the second dielectric layers to a first curing process, wherein substantially all porogen is removed from the first dielectric layer, and wherein some, but not substantially all porogen is removed from the second dielectric layer;

forming a third dielectric layer disposed on a top surface of the second dielectric layer; and transforming the second dielectric layer to a second low-k dielectric layer having a second porous matrix by subjecting the first low-k dielectric layer, and the second and the third dielectric layers to a second curing process, wherein substantially all porogen is removed from the second dielectric layer during the second curing process, wherein the first low-k dielectric layer has a higher dielectric constant than the second low-k dielectric layer.

* * * * *

UNITED STATES PATENT AND TRADEMARK OFFICE
CERTIFICATE OF CORRECTION

PATENT NO. : 7,723,226 B2  Page 1 of 1
APPLICATION NO. : 11/654427
DATED : May 25, 2010
INVENTOR(S) : Yu et al.

It is certified that error appears in the above-identified patent and that said Letters Patent is hereby corrected as shown below:

In Col. 11, line 55, claim 9, delete "baffler" and insert --barrier--.

Signed and Sealed this

Sixth Day of July, 2010

David J. Kappos
*Director of the United States Patent and Trademark Office*